United States Patent [19]

Le et al.

[11] Patent Number: 6,072,725
[45] Date of Patent: Jun. 6, 2000

[54] METHOD OF ERASING FLOATING GATE CAPACITOR USED IN VOLTAGE REGULATOR

[75] Inventors: Binh Quang Le, Mountain View; Shane Charles Hollmer, Sane Jose; Pau-ling Chen, Saratoga, all of Calif.

[73] Assignee: Advanced Micro Devices, Inc., Sunnyvale, Calif.

[21] Appl. No.: 09/237,257

[22] Filed: Jan. 26, 1999

[51] Int. Cl.[7] ................................................. G11C 16/04
[52] U.S. Cl. .............................. 365/185.29; 365/185.18; 365/185.23
[58] Field of Search ........................ 365/185.01, 185.29, 365/185.18, 185.23, 185.27; 357/229, 315; 327/536

[56] References Cited

U.S. PATENT DOCUMENTS

| | | | |
|---|---|---|---|
| 5,406,521 | 4/1995 | Hara ......................................... | 365/218 |
| 5,455,790 | 10/1995 | Hart et al. ........................... | 365/185.11 |
| 5,491,657 | 2/1996 | Haddad et al. ..................... | 365/185.27 |
| 5,610,549 | 3/1997 | Choi ........................................ | 327/536 |

*Primary Examiner*—David Nelms
*Assistant Examiner*—Hoai V. Ho

[57] ABSTRACT

A method and an apparatus are provided for the production and supply of an erase voltage for the initial erasing operation of a floating gate transistor used as a capacitor in a voltage regulator, along with the proper electrical connection of the capacitor's control gate and commonly connected regions. In one embodiment, a capacitor erase control circuit controls a pass transistor for connecting the control gate of the floating gate capacitor to ground and another pass transistor for isolating the commonly connected source, drain and channel regions of the floating gate capacitor (the "well node") from ground. The erase control circuit simultaneously applies a capacitor erase input and a clock input to an erase voltage pass circuit to control a third pass transistor to apply an erase voltage to the well node, thereby erasing the floating gate capacitor. The erase control circuit and erase voltage pass circuit are formed on the same semiconductor substrate as the floating gate capacitor and the other components of the voltage regulator. The erasing methodology and apparatus enables economical implementation of an improved voltage regulator using a floating gate transistor.

12 Claims, 4 Drawing Sheets

METHOD OF ERASING FLOATING GATE CAPACITOR USED IN VOLTAGE REGULATOR

CROSS REFERENCE TO RELATED APPLICATIONS

This application is related to co-pending application Ser. No. 09/023,497 (Attorney Docket No. M-5383 US) entitled "Floating Gate Capacitor for Use in Voltage Regulators" filed on Feb. 13, 1998, co-pending application Ser. No. 09/047,237 (Attorney Docket No. M-5382 US) entitled "Capacitor For Use In a Capacitor Divider That Has a Floating Gate Transistor as a Corresponding Capacitor" and co-pending application Ser. No. 08/808,237 (Attorney Docket No. AMDI 8190 MCF/SES) entitled "High Voltage NMOS Pass Gate for Integrated Circuit With High Voltage Generator" (hereinafter "the related applications") commonly assigned with the present invention.

FIELD OF THE INVENTION

The present invention relates to capacitor dividers. More specifically, it relates to a capacitor divider, used as a voltage regulator, having a floating gate transistor serving as a capacitor.

BACKGROUND OF THE INVENTION

Semiconductor memory circuits require a regulated voltage, typically supplied by a voltage regulator, which regulates a voltage input from a charge pump. Various types of voltage regulators, including those utilizing capacitor dividers, are well known in the art. FIG. 1 shows a capacitor divider in a conventional voltage regulator. Regulator 100 includes a capacitor divider 110 including high and low capacitors 120 and 130 coupled in series between two voltage sources $V_{pp}$ and $V_{ss}$. The common electrical node between high and low capacitors 120 and 130 is a divider output line 140 which is an input line to comparator 160 and carries a varying voltage of $V_{div}$. A reference line 150 having a reference voltage $V_{ref}$ asserted thereon is the second input line to comparator 160. Comparator 160 asserts a signal onto comparator output line 170 which is coupled to a control gate of transistor 180 which has a source coupled to $V_{ss}$ and a drain coupled to $V_{pp}$.

Maintaining a constant capacitive ratio (k) of the capacitor divider 110 as defined by equation 1 improves the performance of capacitor divider 110 and regulator 100.

$$K = C1/(C1+C2) \qquad (1)$$

Where:

C1=Capacitance of high capacitor 120, and

C2=Capacitance of low capacitor 130.

Capacitors 120, 130 are typically conventional N-well or P-well MOS structures, whose capacitance depends on the state at the semiconductor surface, i.e., whether the MOS capacitor is in an accumulation, depletion, or inversion state. FIG. 2 shows a typical curve representing the capacitance of an N-well MOS capacitor as a function of the voltage across the capacitor or gate-to-substrate voltage $V_{gs}$. As seen from FIG. 2, for positive $V_{gs}$, capacitance is essentially voltage-independent when $V_{gs}$ exceeds a certain positive voltage $V_a$ corresponding to the device being in a strong accumulation state.

Accordingly, because the bias voltage or $V_{gs}$ for low capacitor 130 is initially zero (since $V_{div}$ is initially zero volts), low capacitor 130 is not yet in this strong accumulation state (i.e., its well is depleted), and thus capacitance C2 is still voltage dependent. As a result, the accuracy of regulating voltage $V_{pp}$ decreases. Therefore, it is desirable to have a capacitor structure for use in a voltage regulator that exhibits a constant capacitance even at a zero bias voltage level.

Co-pending applications Ser. No. 09/023,497 (Attorney Docket No. M-5383 US) and Ser. No. 09/047,237 (Attorney Docket No. M-5382 US) provide such a capacitor structure, thereby allowing the voltage regulator circuit to precisely regulate the incoming voltage. By using a P-well floating gate NMOS transistor as the low capacitor 130 in a voltage regulator circuit or other circuit for stabilizing a node, a negative threshold voltage for the capacitor can be obtained by erasing the transistor prior to use, thereby allowing the transistor to turn on even when zero volts is applied to the transistor. As a result, during initial operation of the voltage regulator circuit, the capacitor is already in a state where the capacitance is essentially voltage-independent, corresponding to an inversion state. Thus, by replacing the capacitor connected between ground and one input of the operational amplifier in a conventional voltage regulator circuit with the floating gate capacitor of the co-pending applications, precise voltage regulation is possible even at initialization when the voltage across the capacitor is zero.

The floating gate capacitor according to the co-pending applications, as depicted in FIG. 3, is an NMOS floating gate transistor 30 having N-type drain and source regions 32, 33 formed within a P-well 34. P-well 34 is formed within a deep N-well 35, which in turn is formed within a P-type substrate 36. A polysilicon floating gate 39 overlies a channel region 31 between source and drain regions 32, 33, and a polysilicon control gate 40 overlies floating gate 39, with insulative layer 41 separating control gate 40 from floating gate 39 and insulative layer 42 separating floating gate 39 from channel 31. Source and drain regions 32, 33 are commonly connected to a P+ contact 37 and an N+ contact 38 formed within P-well 34 and N-well 35, respectively.

The floating gate transistor can be erased to obtain the desired negative threshold voltage by applying, for example, zero volts to the control gate 40 of the NMOS transistor and approximately 20 volts to the commonly connected source 32, drain 33, and contact regions 37, 38 to force electrons from the floating gate 39 into the substrate 36. In other words, to carry out the erasing operation, it is necessary to ground the control gate 40 and to simultaneously pass an erase voltage of about 20 volts to the commonly connected source, drain and contact regions for a time sufficient to erase the floating gate 39, and then discharge the erase voltage so the voltage regulator circuit can properly function. However, the generation and supply of this high erase voltage, along with the proper electrical connection of the control gate 40 and commonly connected regions to accomplish the erasing operation requires specialized circuitry, preferably on the same semiconductor substrate as the floating gate transistor and the voltage regulator.

There exists a need for a simple methodology and a device for initial erasure of a floating gate transistor used as a capacitor, to enable implementation of an improved voltage regulator using the floating gate transistor.

SUMMARY OF THE INVENTION

According to the present invention, the foregoing and other objects are achieved in part by a method of erasing a floating gate capacitor having a first plate comprising a source, a drain, and a channel region of a floating gate transistor commonly connected at a well node, and a second plate comprising a control gate of the floating gate transistor, which method comprises applying a potential to the gate of a first pass transistor, coupled between the control gate and ground, greater than or equal to its threshold voltage; applying a capacitor erase signal to the gate of a second pass transistor, coupled between the well node and ground, to control the second pass transistor to be turned off; and applying the capacitor erase signal and a clock signal to an erase voltage pass circuit connected to the gate of a third pass transistor, coupled between the well node and an erase voltage source, to control the third pass transistor to apply an erase voltage to the well node to erase the floating gate capacitor.

Another aspect of the present invention is a semiconductor device comprising a floating gate capacitor having a first plate comprising a source, a drain, and a channel region of a floating gate transistor commonly connected at a well node, and a second plate comprising a control gate of the floating gate transistor; a first pass transistor for connecting the control gate to ground when the floating gate capacitor is being erased; a second pass transistor for isolating the well node from ground when the floating gate capacitor is being erased; a third pass transistor for applying an erase voltage to the well node when the floating gate capacitor is being erased; and an erase voltage pass circuit to control the third pass transistor to apply the erase voltage to the well node when the floating gate capacitor is being erased based on a capacitor erase input and a clock input.

An advantage of the present invention is a simple method and apparatus for erasing a floating gate transistor prior to its use as a capacitor in a voltage regulator circuit.

Additional advantages of the present invention will become readily apparent to those skilled in this art from the following detailed description, wherein only the preferred embodiment of the invention is shown and described, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

The present invention provides a method and an apparatus for the production and supply of an erase voltage for the initial erasing operation of a floating gate capacitor used in a voltage regulator, along with the proper electrical connection of the capacitor's control gate and commonly connected regions, on the same semiconductor substrate as the floating gate transistor and the voltage regulator.

According to an embodiment of the invention, to perform the erasing operation, a capacitor erase control circuit controls a pass transistor for connecting the control gate of the floating gate capacitor to ground and another pass transistor for isolating the commonly connected source, drain and channel regions of the floating gate capacitor (known as the "well node") from ground. At the same time, the erase control circuit applies a capacitor erase input and a clock input to an erase voltage pass circuit to control a third pass transistor to apply an erase voltage from an outside voltage source to the well node, thereby erasing the floating gate capacitor. The erase control circuit and erase voltage pass circuit are formed on the same semiconductor substrate as the floating gate capacitor and the other components of the voltage regulator. By providing a simple erasing methodology and apparatus, the present invention enables economical implementation of an improved voltage regulator using a floating gate transistor.

Figure 1:
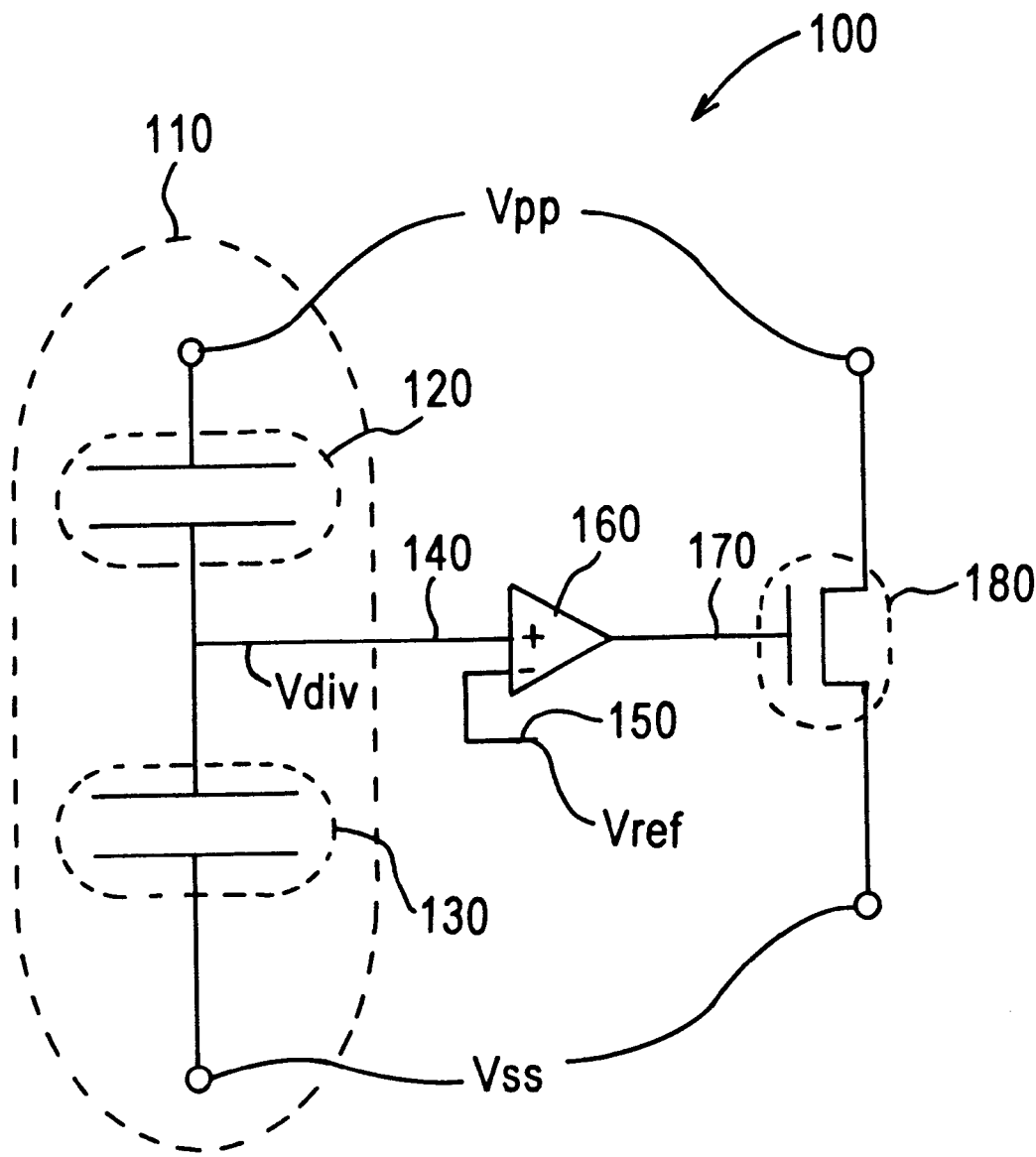
FIG. 1 schematically illustrates a conventional voltage regulator circuit.
Figure 2:
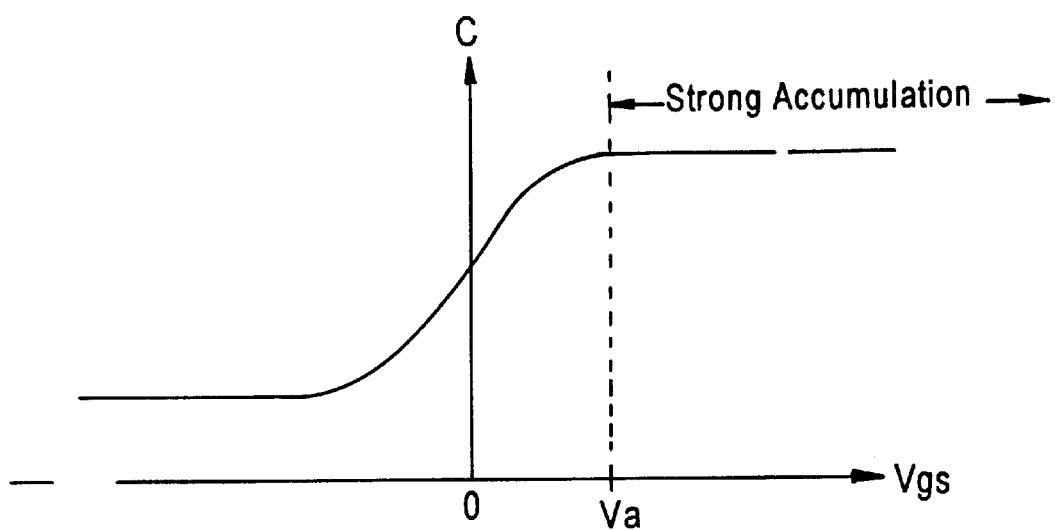
FIG. 2 is a graphical representation of the capacitance of an N-well MOS capacitor as a function of the voltage across the capacitor.
Figure 3:
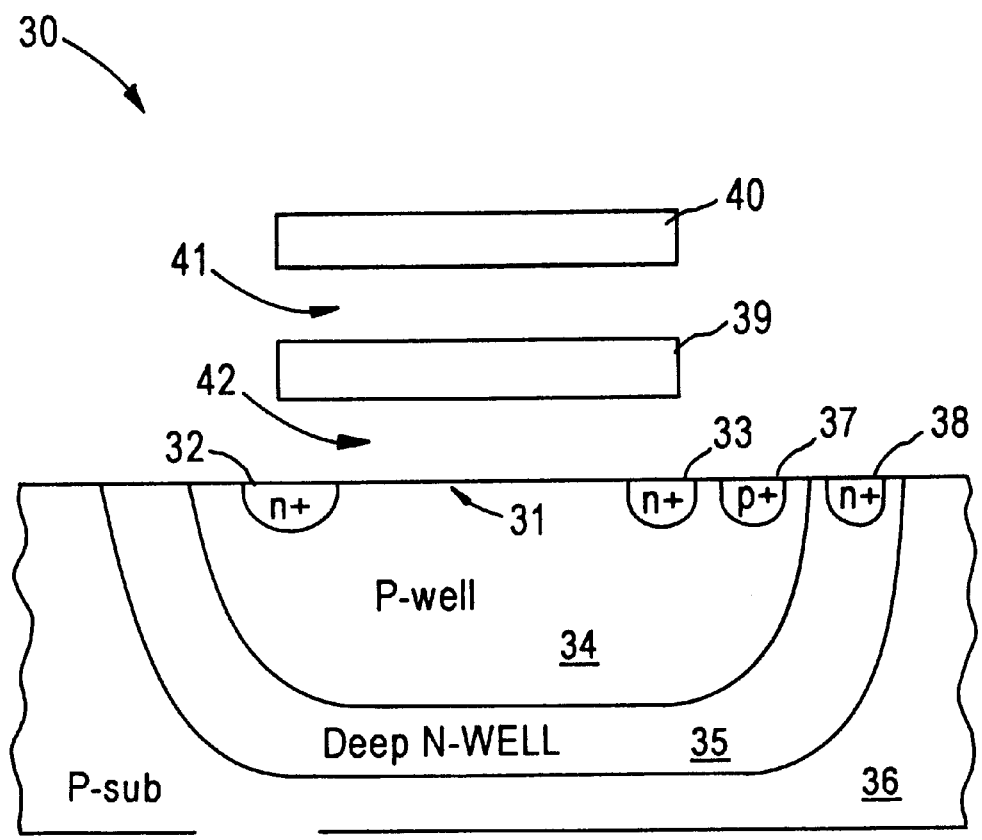
FIG. 3 is a cross-sectional view of a floating gate capacitor used in the present invention.
Figure 4:
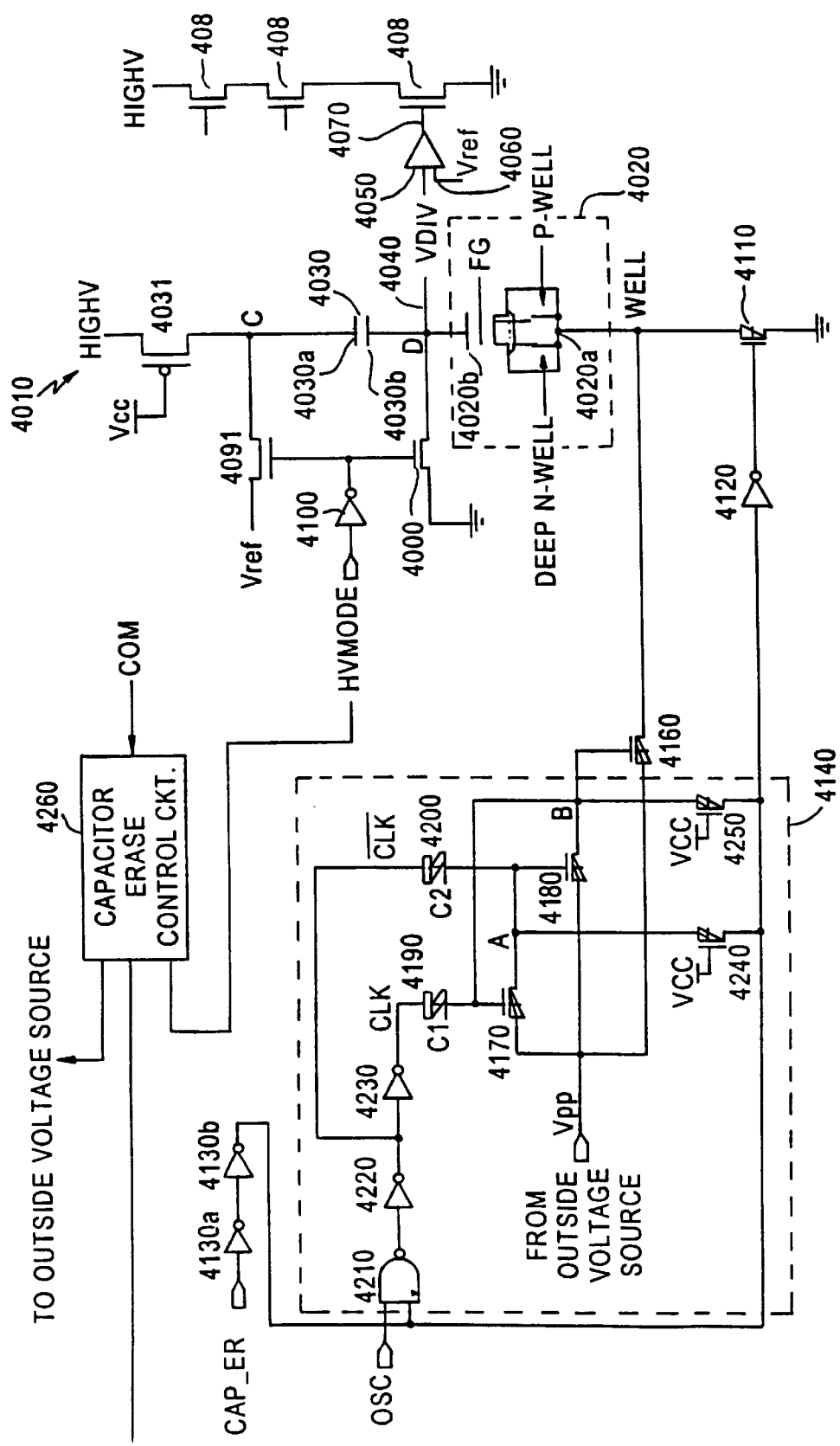
FIG. 4 schematically illustrates a circuit for erasing a floating gate capacitor according to the present invention.

FIG. 4 is a schematic diagram of a circuit for erasing a floating gate capacitor according to an embodiment of the present invention. All the components of FIG. 4 are preferably formed on the same semiconductor substrate. On the right side of the figure is voltage regulator 4010 having a capacitor divider comprising floating gate capacitor 4020 to be erased and second capacitor 4030 coupled in series. Floating gate capacitor 4020 comprises a floating gate transistor having a first plate 4020a comprising its source, drain and channel commonly connected at a well node WELL, and a second plate 4020b comprising its control gate, with floating gate FG between the first and second plates 4020a, 4020b. Second capacitor 4030 has a first plate 4030a coupled to a voltage to be regulated HIGHV through pass transistor 4031 and a second plate 4030b coupled to control gate 4020b.

The connection between capacitors 4020, 4030 is a divider output line 4040, which is an input line to a comparator 4050 and carries a varying voltage of $V_{div}$ when the voltage regulator 4010 is operating. A reference line 4060 having a reference voltage $V_{ref}$ asserted thereon during regulator operation is the second input line to comparator 4050. A comparator output line 4070 is coupled to the gate of pass transistor 4080 to output a difference signal to regulate HIGHV, which flows through pass transistors 4081, 4082. Pass transistor 4090 is coupled between control gate 4020b and ground, and is controlled by signal HVMODE through inverter 4100; i.e., when HVMODE is low, control gate 4020b is connected to ground. Pass transistor 4091 is coupled between node C and $V_{ref}$ and is also controlled by HVMODE. Pass transistor 4110 is coupled between WELL and ground and is controlled by signal CAP_ER through inverters 4120, 4130a and 4130b, so that when CAP_ER is low, WELL is connected to ground.

On the left side of FIG. 4 is erase voltage pass circuit 4140, which passes an erase voltage Vpp of about 20 volts supplied by an outside voltage source; i.e., an "off the chip" voltage source (not shown), to WELL through pass transistor 4160. Erase voltage pass circuit 4140 comprises boost transistors 4170, 4180, boost capacitors 4190, 4200 having capacitances C1 and C2, respectively, NAND gate 4210, inverters 4220, 4230 and precharge/discharge transistors 4240, 4250. The clock signal OSC oscillates between zero and supply voltage Vcc, and is fed through NAND gate 4210 and inverters 4220, 4230 to produce clock signal CLK and the inverted clock /CLK, which is the opposite phase of the clock CLK. When the clock CLK transitions from zero to Vcc, the voltage at node B quickly increases by Vcc*C1/(C1+CB) because capacitances C1 and CB are in series with intermediate node B. CB represents the total capacitance to ground at node B. This capacitance CB is the sum of the drain capacitances of transistors 4180 and 4250, and the gate capacitances of transistors 4160 and 4170. While CLK is at Vcc, boost transistor 4170 charges node A to Vpp. When CLK falls to zero and /CLK rises to Vcc, boost transistor 4170 cuts off, and boost capacitor 4200 increases the voltage at node A by Vcc*C2/(C2+CA). CA represents the total capacitance to ground at node A. This capacitance CA is the sum of the drain capacitances of transistors 4170 and 4240 and the gate capacitance of boost transistor 4180. While /CLK is at Vcc, boost transistor 4180 charges node B to Vpp.

Typically, Vpp is linearly increased from zero to a high voltage. It is desirable for nodes A and B and the output of pass transistor to track Vpp as closely as possible in a selected pass gate. In order for the rising of CLK and /CLK to switch boost transistors 4170 and 4180 on from cut off, the following inequalities must hold:

| | |
|---|---|
| $Vcc*C1/(C1+CB) > Vt_{4170}$ | (Inequality 1) |
| $Vcc*C2/(C2+CA) > Vt_{4180}$ | (Inequality 2) |

The threshold voltages of boost transistors 4170 and 4180 are typically equal ($Vt_{4170}=Vt_{4180}$). Node B has an additional circuit element, the gate of pass transistor 4160, attached to it; therefore, the first inequality is typically the more difficult to satisfy. The size of capacitance C1 can be increased to insure that this inequality is satisfied.

The boosting of nodes A and B is not altogether symmetric however, because node B has the gate capacitance of pass transistor 4160 associated with it while node A has no analogous gate capacitance associated with it. The total load capacitance CB to ground at node B is influenced by all of the circuit elements connected to node B; specifically, the gate capacitance of pass transistor 4160, the drain capacitance of boost transistor 4180, and the gate capacitance of boost transistor 4170. When an increase in voltage of Vcc occurs at the clock input CLK the voltage at node B increases by Vcc * C1 / (C1+CB). In order to enable the turning on of boost transistors 4170 and 4180, this increase in voltage at node B must be greater than the threshold voltage of boost transistor 4170. Thus, Vcc * C1 / (C1+CB) >$Vt_{4170}$. Unless this inequality holds, capacitor C1 is unable to couple the gate of boost transistor 4170 high enough to turn it on. Capacitor C1 is therefore sized to be large if CB is large.

If the clocks CLK and /CLK continue to run after Vpp has reached its highest final value, capacitive coupling through boost transistors 4170 and 4180 will further boost nodes A and B during alternate phases of the clock CLK.

The voltage at node A voltage will oscillate between Vpp to Vpp+Vcc*C2/(C2+CA) in synchronism with /CLK while the voltage at node B will oscillate between Vpp and Vpp+Vcc*C1/(C1+CB) in synchronism with CLK. Boost transistor 4170 will remain in cut off after it has charged node A to Vpp during the high phase of CLK, and boost transistor 4180 will remain in cut off after it has charged node B to Vpp during the high phase of /CLK. Because boost transistors 4170 and 4180 remain in cut off, neither transistor sources any current from Vpp.

The erase voltage pass circuit 4140 is very robust. It performs at a low supply voltage Vcc and high transistor threshold voltages Vt. The above discussion refers to the boost transistor threshold voltages $Vt_{4170}$ and $Vt_{4180}$ as potentially different voltages. However, because typically all of the transistors in the circuit according to the present invention are fabricated using the same doping levels and other fabrication parameters, in practice all transistors will normally have the same threshold voltage Vt.

The erasing operation is controlled by capacitor erase control circuit 4260 in response to command COM. Erase control circuit 4260 is preferably activated by the manufacturer of the semiconductor device before the device is shipped to a user. Upon receipt of command COM, erase control circuit 4260 causes HVMODE to be low, in turn causing inverter 4100 to apply potential to the gate of pass transistor 4090 to connect control gate 4020b to ground. At the same time, CAP_ER is applied to inverter 4130a which, in conjunction with inverter 4130b, amplifies CAP_ER. CAP_ER is then applied to inverter 4120, causing a low signal to be applied to the gate of pass transistor 4110, thus isolating WELL from ground.

CAP_ER is simultaneously applied to NAND gate 4210 along with clock signal OSC. NAND gate 4210 and inverter 4220 together act as an AND gate to supply an amplified clock signal to erase voltage pass circuit 4140. Erase control circuit 4260 also signals the outside voltage source to supply erase voltage Vpp to erase voltage pass circuit 4140 and to pass transistor 4160. Erase voltage pass circuit 4140 supplies the necessary potential to the gate of pass transistor 4160 to allow pass transistor 4160 to pass erase voltage Vpp (about 20 volts) to WELL, thereby erasing floating gate capacitor 4020 such that its threshold voltage becomes negative; i.e., about −2 volts to about −2.5 volts. To achieve this erasure of floating gate capacitor 4020, erase control circuit 4260 preferably applies CAP_ER to inverter 4140 for about 3 ms.

After floating gate capacitor 4020 is erased, WELL and erase voltage pass circuit 4140 are discharged from Vpp (about 20 volts) to the supply voltage Vcc (about 2 volts) using pass transistor 4160 and boost transistors 4170, 4180. Then, CAP_ER is switched off by capacitor erase control circuit 4160, and inverter 4120 applies a high potential to the gate of pass transistor 4110, turning pass transistor 4110 on and connecting WELL to ground.

The present invention enables a floating gate transistor used as a capacitor to be erased using a simple circuit which occupies very little space on the substrate. The elegant solution of the present invention allows the use of the floating gate capacitor in a voltage regulator, which in turn increases the accuracy of the voltage regulator.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of erasing a floating gate capacitor of a circuit comprising the floating gate capacitor and a voltage regulator, the floating gate capacitor having a first plate comprising a source, a drain, and a channel region of a floating gate transistor commonly connected at a well node, and a second plate comprising a control gate of the floating gate transistor; the voltage regulator comprising a first capacitor having a first plate coupled to the control gate and a second plate coupled to a voltage to be regulated, and a comparator having a first input coupled between the control gate and the first plate of the first capacitor and a second input connected to a reference voltage, which method comprises:

applying a potential to the gate of a first pass transistor, coupled between the control gate and ground, greater than or equal to a threshold voltage of the first pass transistor, to connect the control gate to ground;

applying a capacitor erase signal to the gate of a second pass transistor, coupled between the well node and ground, to turn off the second pass transistor and isolate the well node from ground;

applying the capacitor erase signal to an erase voltage pass circuit connected to the gate of a third pass transistor, coupled between the well node and an erase voltage source, to control the third pass transistor to apply an erase voltage to the well node to erase the floating gate capacitor; and applying the capacitor erase signal to the gate of a fourth pass transistor, coupled between the second plate of the first capacitor and the reference voltage.

2. The method according to claim 1, wherein the erase voltage is about 20 volts.

3. The method according to claim 1, comprising erasing the floating gate capacitor such that the threshold voltage of the erased floating gate capacitor is negative.

4. The method according to claim 3, wherein the erased floating gate capacitor threshold voltage is about −2 volts to about −2.5 volts.

5. The method according to claim 3, comprising clocking the capacitor erase signal so as to apply the capacitor erase signal for about 3 ms.

6. The method according to claim 1, further comprising:

removing the capacitor erase signal from the gate of the second pass transistor after the floating gate capacitor is erased, to control the second pass transistor to be turned on to connect the well node to ground; and discharging the well node through the erase voltage pass circuit after the floating gate capacitor is erased.

7. A semiconductor device comprising:

a floating gate capacitor having a first plate comprising a source, a drain, and a channel region of a floating gate transistor commonly connected at a well node, and a second plate comprising a control gate of the floating gate transistor;

a first pass transistor for connecting the control gate to ground when the floating gate capacitor is being erased;

a second pass transistor for isolating the well node from ground when the floating gate capacitor is being erased;

a third pass transistor for applying an erase voltage to the well node when the floating gate capacitor is being erased;

an erase voltage pass circuit to control the third pass transistor to apply the erase voltage to the well node when the floating gate capacitor is being erased based on a capacitor erase input; and a voltage regulator circuit comprising a first capacitor having a first plate coupled to the control gate and a second plate coupled to a voltage to be regulated, and a comparator having a first input coupled between the control gate and the first plate of the first capacitor, a second input connected to a reference voltage, and an output connected to a fourth pass transistor.

8. The semiconductor device of claim 7, wherein the erase voltage is about 20 volts.

9. The semiconductor device of claim 7, further comprising a capacitor erase control circuit for applying a first potential to control the first pass transistor for connecting the control gate to ground when the floating gate capacitor is being erased, for applying the capacitor erase input to the erase voltage pass circuit when the floating gate capacitor is being erased, and for applying the capacitor erase input to control the second pass transistor to isolate the well node from ground when the floating gate capacitor is being erased.

10. The semiconductor device according to claim 9, wherein the capacitor erase control circuit is clocked to apply the capacitor erase input for about 3 ms.

11. The semiconductor device according to claim 7, wherein the erase voltage pass circuit controls the third pass transistor to apply the erase voltage to the well node responsive to a logical product of a clock input and the capacitor erase input.

12. The semiconductor device according to claim 9, wherein the floating gate capacitor, first, second and third pass transistors, erase voltage pass circuit and capacitor erase control circuit are formed on a common semiconductor substrate.

\* \* \* \* \*